United States Patent
Wen et al.

(10) Patent No.: US 6,613,696 B2
(45) Date of Patent: Sep. 2, 2003

(54) METHOD OF FORMING COMPOSITE SILICON OXIDE LAYER OVER A SEMICONDUCTOR DEVICE

(75) Inventors: Hai-Hung Wen, Kaohsiung (TW); Yu-Chih Chuang, Hsinchu Hsien (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/900,055

(22) Filed: Jul. 6, 2001

(65) Prior Publication Data

US 2001/0048146 A1 Dec. 6, 2001

Related U.S. Application Data

(62) Division of application No. 09/515,015, filed on Feb. 29, 2000.

(30) Foreign Application Priority Data

Dec. 31, 1999 (TW) .............................. 88123394 A

(51) Int. Cl.[7] .............................................. H01L 21/31
(52) U.S. Cl. .................... 438/769; 438/723; 438/724; 438/743; 438/744; 438/787; 438/791; 257/639
(58) Field of Search ................. 438/622, 624, 438/627, 765, 769, 723, 724, 743, 744, 755–757, 787, 791; 257/347, 363, 379, 904, 639

(56) References Cited

U.S. PATENT DOCUMENTS

| | | | | |
|---|---|---|---|---|
| 5,047,826 A | * | 9/1991 | Keller et al. | 257/370 |
| 5,252,515 A | * | 10/1993 | Tsai et al. | 438/624 |
| 5,859,458 A | * | 1/1999 | Hsueh et al. | 257/347 |
| 6,020,243 A | * | 2/2000 | Wallace et al. | 257/213 |
| 6,174,797 B1 | * | 1/2001 | Bao et al. | 438/624 |
| 6,489,213 B1 | * | 12/2002 | Hsueh et al. | 438/382 |

* cited by examiner

Primary Examiner—Hoai Ho
Assistant Examiner—Long Tran
(74) Attorney, Agent, or Firm—J.C. Patents

(57) ABSTRACT

A method of forming a composite silicon oxide layer over a semiconductor device. The composite silicon oxide layer is formed between the semiconductor device and a doped silicate glass layer. The composite silicon oxide layer comprises two silicon oxide layers, each having a different silicon/oxide composition. The oxygen-rich oxide layer or silicon dioxide layer is formed directly above the semiconductor device, and the silicon-rich oxide layer is formed above the silicon dioxide layer next to the doped silicate glass layer. Both the silicon dioxide layer and the silicon-rich oxide layer are formed in the same plasma deposition chamber.

24 Claims, 3 Drawing Sheets

METHOD OF FORMING COMPOSITE SILICON OXIDE LAYER OVER A SEMICONDUCTOR DEVICE

CROSS-REFERENCE TO RELATED APPLICATION

This application is a divisional application of, and claims the priority benefit of, U.S. application Ser. No. 09/515,015 filed on Feb. 29, 2000.

BACKGROUND OF THE INVENTION

1. Field of Invention

The present invention relates to a method of forming a semiconductor device. More particularly, the present invention relates to a method of forming a composite silicon oxide layer over a semiconductor device.

2. Description of Related Art

In most semiconductor devices, doped silicate glass such as borophosphosilicate glass (BPSG) is generally used as an inter-layer dielectric (ILD). This is because doped silicate glass has a low annealing temperature, thereby possessing and ability to lower the thermal budget of fabrication. However, due to the high porosity of doped silicate glass, some of the dopants inside the silicate glass can easily diffuse into neighboring layers at a moderately high temperature. Thus, semiconductor devices under the silicate glass layer may be contaminated in the back-end process, leading to reliability problems.

To prevent the contamination of a semiconductor device by dopants inside silicate glass, an isolating layer is often formed between the semiconductor device and the silicate glass layer. In other words, before doped silicate glass is deposited to form the inter-layer dielectric (ILD), undoped ozone-TEOS oxide (USG), plasma-enhanced chemical vapor deposition (PECVD) oxide, or silicon-rich oxide (SRO approximated formula $SiO_x$, x<2) is first deposited over the semiconductor device. Among USG, PECVD oxide and silicon-rich oxide, silicon-rich oxide is the best material for preventing device contamination.

However, using silicon-rich oxide as an isolation layer has its own problems too. In depositing silicon-rich oxide, hydrogen molecules are often produced. These hydrogen molecules are often retained inside the silicon-rich oxide after the reaction, leading to a possible contamination of nearby semiconductor devices. Consequently, hot carrier degradation, current leakage and resistivity change of semiconductor devices occur more frequently.

SUMMARY OF THE INVENTION

Accordingly, one object of the present invention is to provide a method of forming a composite silicon oxide layer over a semiconductor device so that hot carrier degradation, current leakage and resistivity change of the device are minimized.

To achieve these and other advantages and in accordance with the purpose of the invention, as embodied and broadly described herein, the invention provides a method of forming a composite silicon oxide layer. The composite silicon oxide layer is formed between the semiconductor device and a doped silicate glass layer. This composite silicon oxide layer is composed of two silicon oxide layers, each having a different silicon-to-oxygen ratio. The silicon oxide layer that contacts the doped silicate glass layer is a silicon-rich oxide layer ($SiO_x$, x<2), while the other silicon oxide layer that contacts the semiconductor device is a silicon dioxide ($SiO_2$) layer.

In addition, the two silicon oxide layers having different silicon/oxygen ratios are formed in the same plasma deposition step. The plasma deposition is carried out using, for example, $SiH_4$—$N_2O$ plasma. The method of controlling the silicon/oxygen ratios in each of the two silicon oxide layers includes changing the ratio of $SiH_4$ to $N_2O$ in the $SiH_4$—$N_2O$ plasma.

In this invention, since the silicon-rich oxide layer of the composite layer is in contact with the doped silicate glass layer, dopants inside the doped silicate glass layer are prevented from diffusing into and contaminating the semiconductor device underneath. On the other hand, since the silicon dioxide layer in the composite layer is attached to the semiconductor device, any residual hydrogen molecules in the silicon-rich oxide is prevented from crossing into the underlying semiconductor device. Therefore, resistivity of the semiconductor device can be maintained and leakage current from the semiconductor device can be minimized.

Furthermore, since the two silicon oxide layers are formed by plasma deposition reactions in the same plasma chemical vapor deposition chamber, there is no additional complication other than that of forming a single silicon-rich oxide layer.

In brief, the composite silicon oxide layer of this invention is capable of preventing dopants in the doped silicate glass layer as well as residual hydrogen molecules in the silicon-rich oxide layer from contaminating the semiconductor device. Hence, quality of the semiconductor can be maintained. Moreover, since the two silicon oxide layers are formed in the same reaction chamber, no additional steps need to be taken.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

Figure 1:
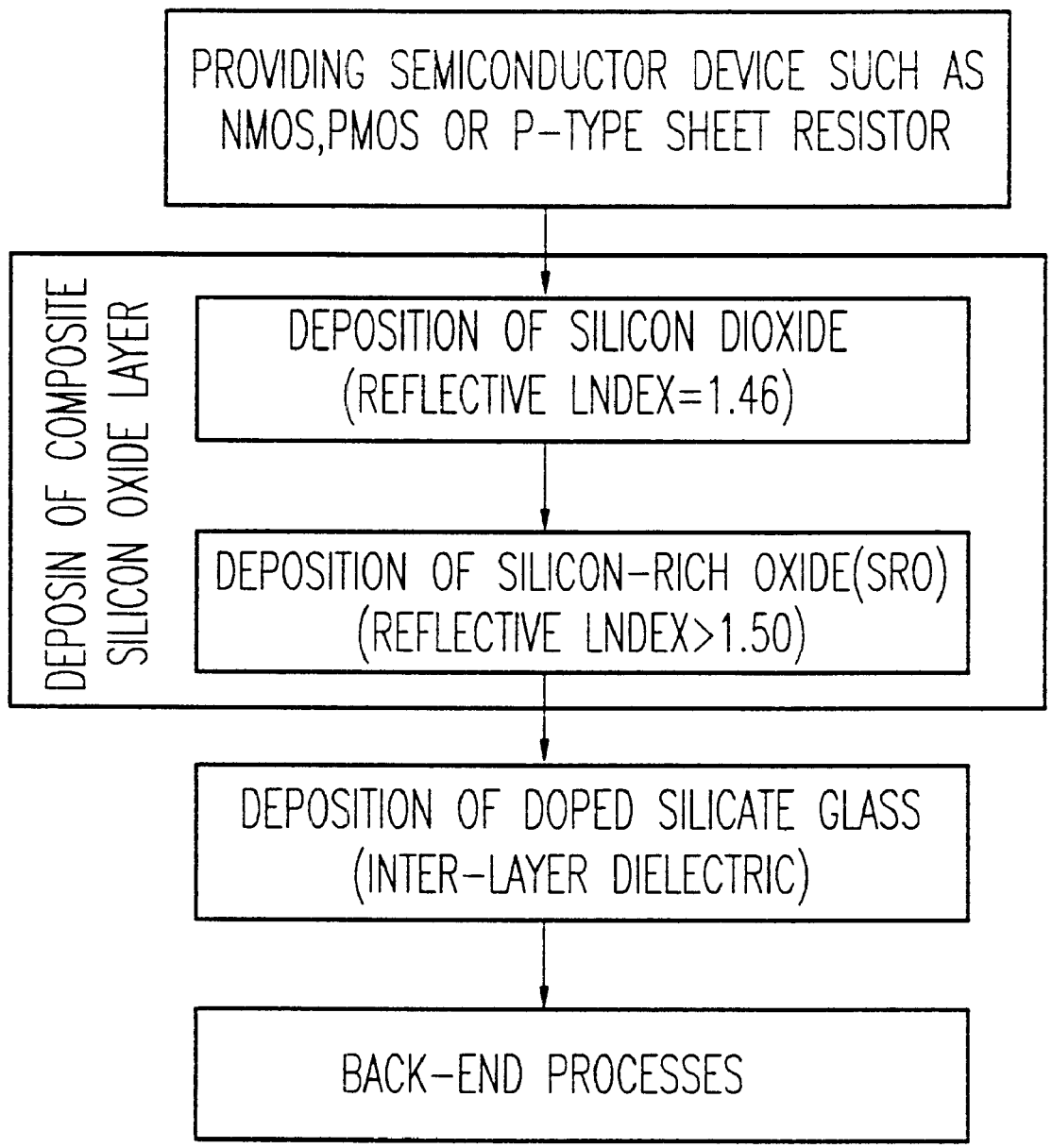
FIG. 1 is a flow chart showing the steps for forming the composite silicon oxide layer over a semiconductor device according to this invention.

Note that the silicon/oxygen ratio in the silicon-rich oxide layer is indicated by the refractive index (RI). In other words the higher the silicon/oxygen ratio, the higher the refractive index will be.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a flow chart showing the steps for forming the composite silicon oxide layer over a semiconductor device according to this invention. First, as shown in FIG. 1, a substrate having a device such as an NMOS transistor, a PMOS transistor, or a P-type sheet resistor therein is provided. Steps for forming the composite silicon oxide layer are next conducted. In other words, a silicon dioxide layer is first formed over the substrate, and then a silicon-rich oxide layer is formed over the silicon dioxide layer by changing the deposition reaction conditions. Finally, a doped silicate glass layer that functions as an inter-layer dielectric is formed over the silicon-rich oxide layer. In FIG. 1, the refractive index (RI) is an indication of silicon/oxygen ratio inside the silicon oxide layers. For instance, the silicon dioxide layer has a refractive index of 1.46 while the silicon-rich oxide ($SiO_x$, x<2) layer has a refractive index greater than 1.46. Moreover, the greater the value of the refractive index, the higher the ratio of silicon to oxygen will be. In the embodiment of this invention, refractive index of the silicon-rich oxide layer is between about 1.50 and 1.55.

In this invention, the silicon dioxide layer and the silicon-rich oxide layer of the composite silicon oxide layer are formed in the same plasma deposition step. The plasma used in the plasma deposition is preferably $SiH_4$—$N_2O$ plasma. By varying the ratio between $SiH_4$ and $N_2O$ in the $SiH_4$—$N_2O$ plasma, the silicon dioxide layer and the silicon-rich oxide layer with a pre-defined silicon/oxygen ratio can be formed in sequence over the semiconductor device in the same step. For example, the silicon dioxide layer is formed in a plasma chamber by setting the flow rate of $SiH_4$ to 125 $cm^3$/min and the flow rate of $N_2O$ to 2000 $cm^3$/min. On the other hand, to form the silicon-rich oxide layer having a refractive index of 1.52, the flow rate of $SiH_4$ is set to 150 $cm^3$/min while the flow rate of $N_2O$ is set to 680 $cm^3$/min.

In the following description, a composite silicon oxide layer is formed over an NMOS transistor and a P-type sheet resistor, respectively, to illustrate some applications (in FIGS. 2 and 3) of this invention. The advantages of this invention are illustrated through some testing figures (in FIGS. 4 and 5).

Figure 2:
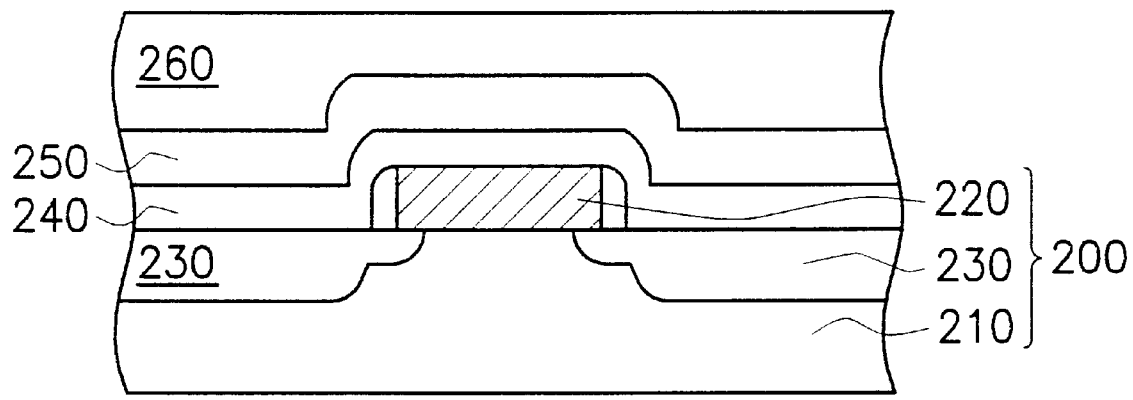
FIG. 2 is a schematic cross-sectional view showing a composite silicon oxide layer over an N-type metal oxide semiconductor (NMOS) structure according to one preferred embodiment of this invention.

FIG. 2 is a schematic cross-sectional view showing a composite silicon oxide layer over an N-type metal oxide semiconductor (NMOS) structure according to one preferred embodiment of this invention. As shown in FIG. 2, the NMOS transistor 200 includes a P-type silicon substrate 210, a polysilicon gate 220 and source/drain regions 230. A silicon dioxide layer 240, a silicon-rich oxide layer 250 and a doped silicate glass layer 260 (inter-layer dielectric) are sequentially formed over the NMOS transistor 200. The silicon dioxide layer 240 and the silicon-rich oxide layer 250 together form the composite silicon oxide layer of this invention.

Figure 3:
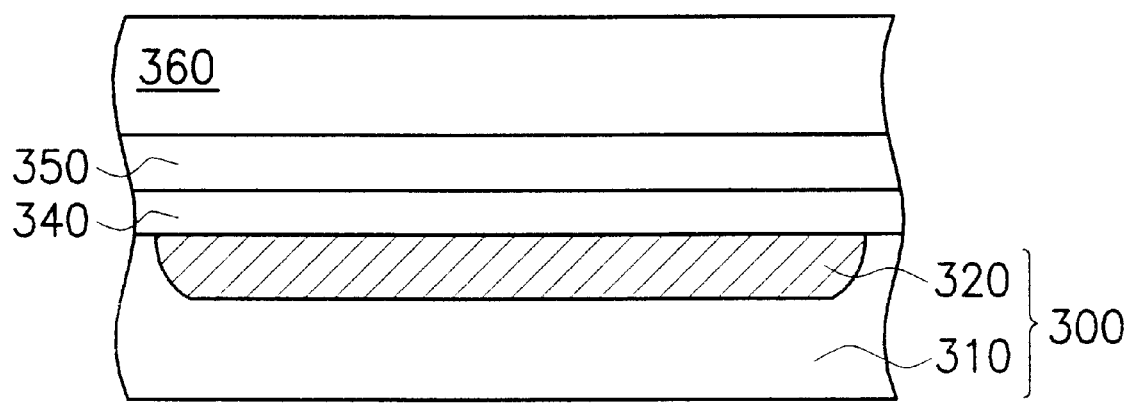
FIG. 3 is a schematic cross-sectional view showing a composite silicon oxide layer over a P-type sheet resistor according to one preferred embodiment of this invention.

FIG. 3 is a schematic cross-sectional view showing a composite silicon oxide layer over a P-type sheet resistor according to one preferred embodiment of this invention. As shown in FIG. 3, the P-type sheet resistor 300 includes an N-type well 310 and a P-type diffusion region 320. A silicon dioxide layer 340, a silicon-rich oxide layer 350 and a doped silicate glass layer 360 (inter-layer dielectric) are sequentially formed over the P-type diffusion region 320. The silicon dioxide layer 340 and the silicon-rich oxide layer 350 together form the composite silicon oxide layer of this invention.

In the examples of FIGS. 2 and 3, the silicon-rich oxide layers 250 and 350 have a thickness of about 1000 Å to 2000 Å while the silicon dioxide layers 240 and 340 have a thickness of about 200 Å to 1000 Å.

Figure 4:
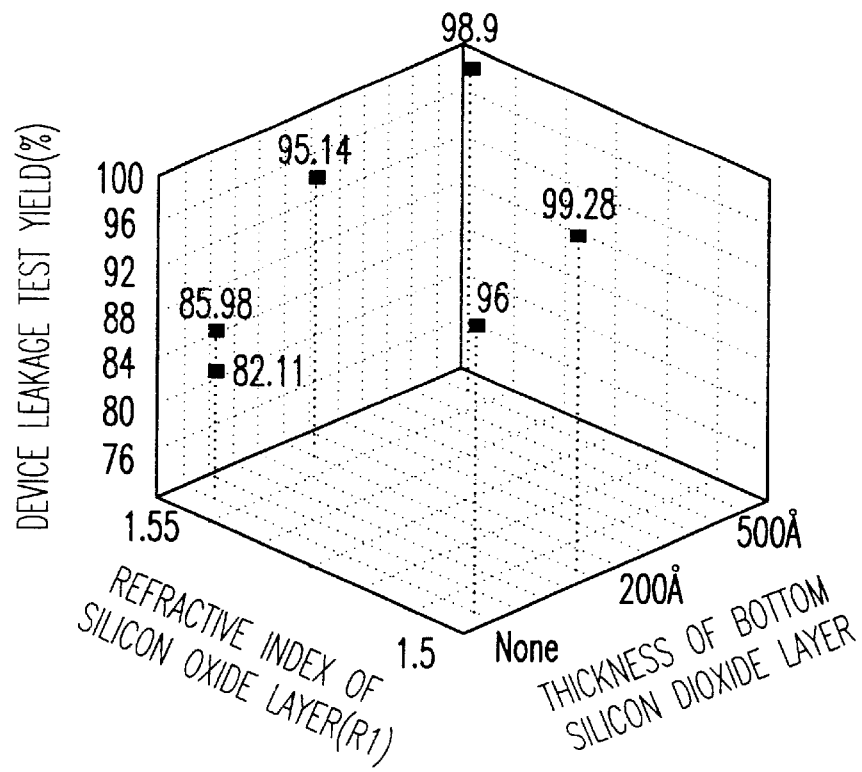
FIG. 4 is a three-dimensional diagram showing thickness variation of the silicon dioxide layer and refractive index variation (silicon/oxygen variation) of the silicon-rich oxide layer versus yield in leakage current test for an NMOS device with a composite silicon oxide layer thereon according to this invention.

FIG. 4 is a three-dimensional diagram showing thickness variation of the silicon dioxide layer 240 and refractive index variation (silicon/oxygen variation) of the silicon-rich oxide layer 250 versus yield in leakage current test for the NMOS device 200 with a composite silicon oxide layer thereon according to this invention. As shown in FIG. 4, when the refractive index of the silicon-rich oxide layer 250 is fixed (at a fixed silicon/oxide ratio), a greater thickness of the silicon dioxide layer 240 means a smaller leakage current. When the refractive index of the silicon-rich oxide layer 250 is at the maximum value of 1.55, leakage current is considerably lowered by a silicon dioxide layer 240 that is just 500 Å thick. In other words, current leaks are effectively stopped by the silicon dioxide layer 240 in the composite oxide layer of this invention.

Figure 5:
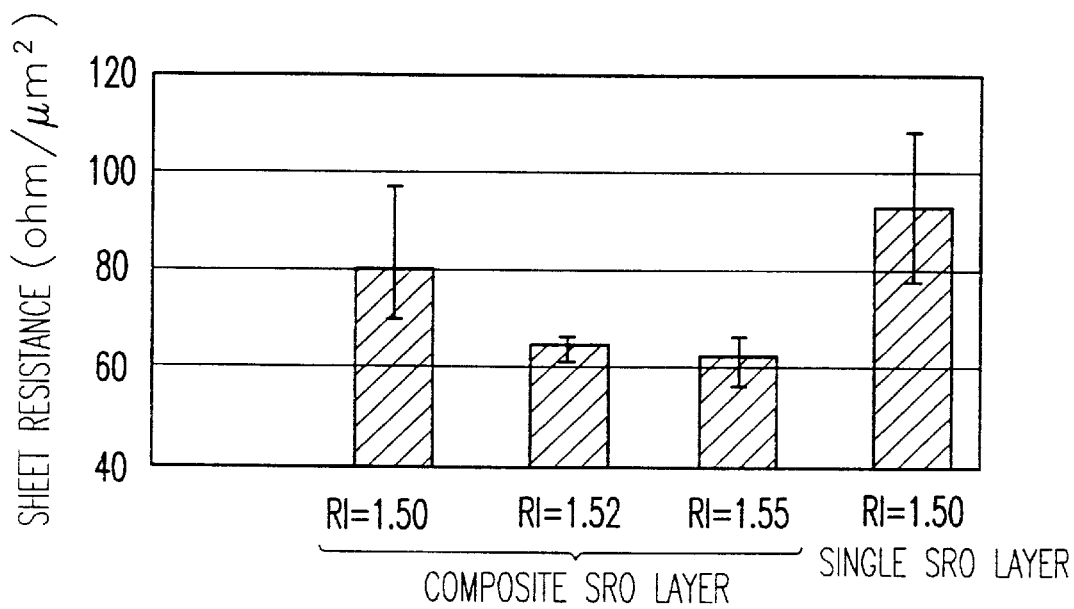
FIG. 5 is a bar chart showing the effect of refractive index variation (silicon/oxygen variation) of the silicon-rich oxide layer on resistivity for a P-type resistor with a composite silicon oxide layer thereon according to this invention.

FIG. 5 is a bar chart showing the effect of refractive index variation (silicon/oxygen variation) of the silicon-rich oxide layer 350 on resistivity for a P-type resistor 300 with a composite silicon oxide layer thereon according to this invention. As shown in FIG. 5, the effect of the composite silicon oxide layer on the resistance of the P-type sheet resistor 300 is smaller (that is, error range of resistance value is smaller) compared with a P-type sheet resistor protected by just one silicon-rich oxide layer. In other words, the composite silicon oxide layer is better able to stabilize the resistance of the P-type sheet resistor 300. The error range of the resistor is lowered considerably, especially when the refractive index (or silicon/oxygen ratio) of the silicon-rich oxide layer is between about 1.52 and 1.55.

In summary, since the silicon-rich oxide layer of the composite layer is in contact with the doped silicate glass layer, dopants inside the doped silicate glass layer are prevented from diffusing into and contaminating the semiconductor device underneath. On the other hand, since the silicon dioxide layer in the composite layer is attached to the semiconductor device, any residual hydrogen molecules in the silicon-rich oxide layer is prevented from crossing into the underlying semiconductor device. Therefore, resistivity of the semiconductor device can be stabilized and leakage current from the semiconductor device can be minimized. Furthermore, since the two silicon oxide layers are formed by plasma deposition in the same plasma chemical vapor deposition chamber, there is no additional complication than that of forming a single silicon-rich oxide layer.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a composite dielectric layer over a semiconductor device, comprising the steps of:

conducting a plasma deposition with reaction gases to form a silicon dioxide layer over the semiconductor device;

continuing the plasma deposition with the same reaction gases under different conditions to form a silicon-rich oxide layer over the silicon dioxide layer; and forming a doped silicate glass layer over the silicon-rich oxide layer.

2. The method of claim 1, wherein the plasma used in the plasma deposition includes $SiH_4$—$N_2O$ plasma.

3. The method of claim 2, wherein the step of forming the silicon dioxide layer and the silicon-rich oxide layer over the silicon dioxide layer includes changing a ratio of $SiH_4$ to $N_2O$ in the $SiH_4$—$N_2O$ plasma.

4. The method of claim 1, wherein the silicon-rich oxide layer has a thickness of about 1000 Å to 2000 Å.

5. The method of claim 1, wherein the silicon-rich oxide layer has a refractive index of between about 1.50 and 1.55.

6. The method of claim 1, wherein the silicon dioxide layer has a thickness of about 200 Å to 1000 Å.

7. A method of forming a composite silicon oxide layer over a semiconductor device, comprising the steps of:

providing a substrate having a metal-oxide-semiconductor (MOS) transistor thereon;

conducting a plasma deposition with reaction gases to form a silicon dioxide layer over the substrate;

continuing the plasma deposition with the same reaction gases under different conditions to form a silicon-rich oxide layer over the silicon dioxide layer; and forming a doped silicate glass layer over the silicon-rich oxide layer.

8. The method of claim 7, wherein a plasma used in the plasma deposition includes $SiH_4$—$N_2O$ plasma.

9. The method of claim 8, wherein the step of forming the silicon dioxide layer and the silicon-rich oxide layer over the silicon dioxide layer includes changing a ratio of $SiH_4$ to $N_2O$ in the $SiH_4$—$N_2O$ plasma.

10. The method of claim 7, wherein the MOS transistor includes an N-type MOS (NMOS) transistor.

11. The method of claim 7, wherein the MOS transistor includes a P-type MOS (PMOS) transistor.

12. The method of claim 7, wherein the silicon-rich oxide layer has a thickness of about 1000 Å to 2000 Å.

13. The method of claim 7, wherein the silicon-rich oxide layer has a refractive index of between about 1.50 and 1.55.

14. The method of claim 7, wherein the silicon dioxide layer has a thickness of about 200 Å to 1000 Å.

15. The method of claim 7, wherein the doped silicate glass layer includes a borophosphosilicate glass layer.

16. A method of forming a composite silicon oxide layer over a semiconductor device, comprising the steps of:

providing a substrate having a sheet resistor thereon;

conducting a plasma deposition with reaction gases to form a silicon dioxide layer over the substrate;

continuing the plasma deposition with the same reaction gases under different conditions to form a silicon-rich oxide layer over the silicon dioxide layer; and forming a doped silicate glass layer over the silicon-rich oxide layer.

17. The method of claim 16, wherein a plasma used in the plasma deposition includes $SiH_4$—$N_2O$ plasma.

18. The method of claim 17, wherein the step of forming the silicon dioxide layer and the silicon-rich oxide layer over the silicon dioxide layer includes changing the ratio of $SiH_4$ to $N_2O$ in the $SiH_4$—$N_2O$ plasma.

19. The method of claim 16, wherein the sheet resistor includes a P-type sheet resistor.

20. The method of claim 16, wherein the sheet resistor includes an N-type sheet resistor.

21. The method of claim 16, wherein the silicon-rich oxide layer has a thickness of about 1000 Å to 2000 Å.

22. The method of claim 16, wherein the silicon-rich oxide layer has a refractive index of between about 1.50 and 1.55.

23. The method of claim 16, wherein the silicon dioxide layer has a thickness of about 200 Å to 1000 Å.

24. The method of claim 16, wherein the doped silicate glass layer includes a borophosphosilicate glass layer.

* * * * *